(12) United States Patent
Souriau et al.

(10) Patent No.: US 8,288,841 B2
(45) Date of Patent: Oct. 16, 2012

(54) HANDLE WAFER HAVING VIEWING WINDOWS

(75) Inventors: Jean-Charles Souriau, Saint-Egreve (FR); Stéphane Caplet, Sassenage (FR)

(73) Assignee: Commissariat à l'Énergie Atomique et aux Énergies Alternatives, Paris (FR)

( * ) Notice: Subject to any disclaimer, the term of this patent is extended or adjusted under 35 U.S.C. 154(b) by 122 days.

(21) Appl. No.: 12/827,171

(22) Filed: Jun. 30, 2010

(65) Prior Publication Data

US 2011/0006400 A1 Jan. 13, 2011

(30) Foreign Application Priority Data

Jul. 9, 2009 (FR) ...................................... 09 54779

(51) Int. Cl.
*H01L 29/00* (2006.01)
(52) U.S. Cl. ................. 257/618; 257/686; 257/E21.536
(58) Field of Classification Search .................. 257/618, 257/686
See application file for complete search history.

(56) References Cited

U.S. PATENT DOCUMENTS

| | | | |
|---|---|---|---|
| 4,322,980 A | 4/1982 | Suzuki et al. | |
| 4,958,216 A | 9/1990 | Tanaka et al. | |
| 5,353,195 A | 10/1994 | Fillion et al. | |
| 5,353,498 A | 10/1994 | Fillion et al. | |
| 5,497,033 A | 3/1996 | Fillion et al. | |
| 5,904,502 A | 5/1999 | Ference | |
| 5,909,052 A | 6/1999 | Ohta et al. | |
| 6,154,366 A | 11/2000 | Ma et al. | |
| 6,998,533 B2 | 2/2006 | De Samber et al. | |
| 7,202,107 B2 | 4/2007 | Fuergut et al. | |
| 2004/0014258 A1 | 1/2004 | Nakamura | |
| 2004/0201012 A1 | 10/2004 | Faris | |
| 2005/0013019 A1 | 1/2005 | Tseng et al. | |
| 2005/0215030 A1 | 9/2005 | Yamamoto | |
| 2006/0051895 A1 | 3/2006 | Abe et al. | |
| 2006/0207087 A1 | 9/2006 | Jafri et al. | |
| 2006/0220222 A1 | 10/2006 | Zeng | |
| 2006/0267213 A1 | 11/2006 | Ozguz et al. | |
| 2006/0273469 A1 | 12/2006 | Beer et al. | |
| 2007/0080458 A1 | 4/2007 | Ogawa et al. | |
| 2007/0096305 A1 | 5/2007 | Fuergut et al. | |
| 2007/0108610 A1 | 5/2007 | Kondo | |
| 2007/0117369 A1 | 5/2007 | Val et al. | |
| 2008/0142946 A1 | 6/2008 | Yang et al. | |
| 2009/0017580 A1* | 1/2009 | Smith .......................... 438/107 |

(Continued)

FOREIGN PATENT DOCUMENTS

DE 199 07 295 C1 2/2001

(Continued)

OTHER PUBLICATIONS

Rama Puligadda, et al., "High-Performance Temporary Adhesives for Wafer Bonding Applications", Mater. Res. Soc. Symp. Proc. vol. 970, Materials Research Society, XP-002495201, 2007, 11 pages.

(Continued)

*Primary Examiner* — Dung A. Le
(74) *Attorney, Agent, or Firm* — Oblon, Spivak, McClelland, Maier & Neustadt, L.L.P.

(57) ABSTRACT

A handle wafer for microelectronic functional wafers, including at least one cavity through the thickness of the wafer, this cavity including a viewing window in solid or solidified material.

9 Claims, 6 Drawing Sheets

U.S. PATENT DOCUMENTS

| | | |
|---|---|---|
| 2010/0047567 A1 | 2/2010 | Souriau |
| 2010/0195299 A1 | 8/2010 | Souriau et al. |

FOREIGN PATENT DOCUMENTS

| | | |
|---|---|---|
| EP | 0 154 431 A1 | 9/1985 |
| EP | 0 611 129 A2 | 8/1994 |
| EP | 1 596 433 A1 | 11/2005 |
| FR | 2 857 157 | 1/2005 |
| FR | 2 864 342 | 6/2005 |
| GB | 2 202 673 A | 9/1988 |
| GB | 2 224 600 A | 5/1990 |
| WO | WO 00/14788 | 3/2000 |
| WO | WO 2004/112136 A1 | 12/2004 |
| WO | WO 2008/155231 A1 | 12/2008 |

OTHER PUBLICATIONS

Chang-Lee Chen, et al., "Bond Wireless Multichip Packaging Technology for High-Speed Circuits", IEEE Transactions on Components, Hybrids and Manufacturing Technology, vol. 15, No. 4, Aug. 1992, pp. 451-456.

Preliminary Search Report issued Feb. 5, 2010, in French Patent Application No. 0954779 (with Engligh translation of category of cited documents).

* cited by examiner

HANDLE WAFER HAVING VIEWING WINDOWS

TECHNICAL FIELD AND PRIOR ART

The invention relates to microelectronic methods or applying microsystems.

In such methods, an alignment may have to be made on patterns which are themselves masked for example by a temporary support (a so-called handle) by a casing.

This case appears for example when a wafer of thinned semiconducting material is used with a thickness of less than 300 μm. Such a wafer is then very brittle and it is not possible to handle it in conventional microelectronics equipment.

A typical exemplary method requiring alignment is photolithography. Alignment with the photolithographic mask is achieved with patterns engraved on the semiconducting wafer. There again, a temporary support (or handle) masks these alignment marks.

Figure 1A:
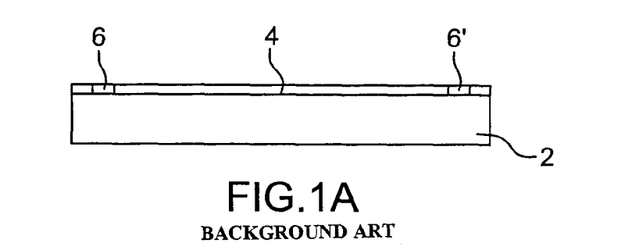
FIGS. 1A-1C illustrate a method according to the prior art.
Figure 1B:
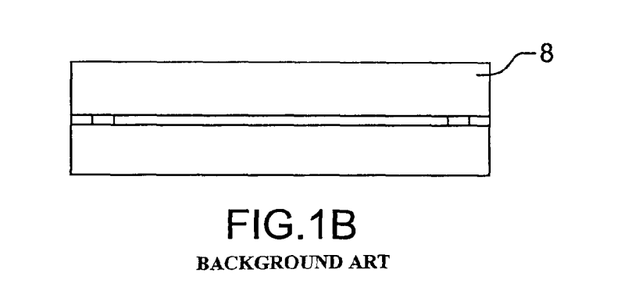
Figure 1C:
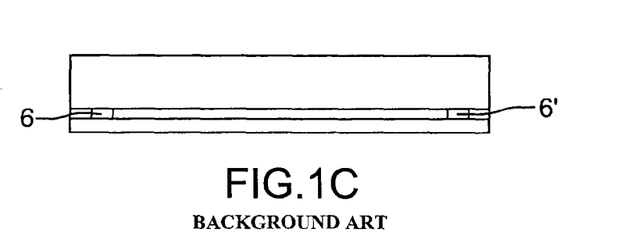

FIG. 1A illustrates a wafer 2 which includes, on its front face 4, alignment areas 6, 6'. These areas, including alignment marks or patterns, will allow positioning of the components and/or of any other semiconducting elements, for example another wafer, in a certain position relatively to the surface 4 of the substrate 2. This wafer 2 is transferred through its front face onto a handle wafer 8 (FIG. 1B). But the latter then masks the alignment marks or patterns 6, 6' and prevents achievement of the desired alignment. FIG. 1C illustrates the same wafer 2, after a thinning operation, the marks are not always visible.

Figure 2:
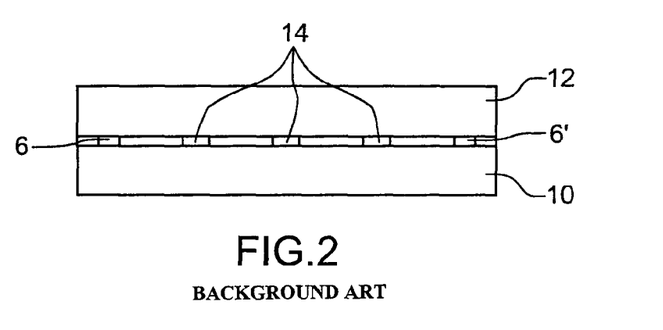
FIG. 2 illustrates an assembly of a casing with a substrate supporting MEMS.

Another case which may occur is the one illustrated in FIG. 2 where a casing 12 is transferred onto the front face of a wafer 10 including sensitive areas 14 to be protected (for example including an MEMS, or an NEMS, or an MOEMS etc. . . . ).

In this case, as in the previous one, the alignment areas 6, 6' are found masked by the casing 12 and are no longer visible.

To this day, the provided solutions propose the use of a transparent handle wafer 8 or a transparent casing 12.

However, when wafers of different natures are assembled at high temperatures, the thermal expansion difference of the two wafers leads to deformation of the assembly upon returning to room temperature. This is the case with wafers in a transparent material.

Figure 3A:
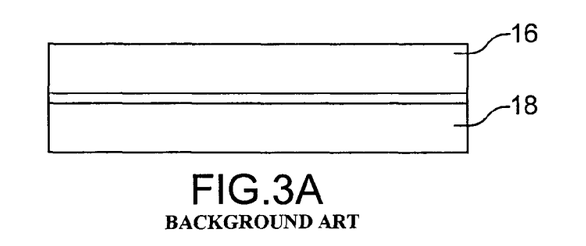
FIGS. 3A-3B illustrate the problems of TEC (thermal expansion coefficient) differences.

FIG. 3A exactly illustrates the assembling of a transparent handle 16 with a wafer 18 at a high temperature.

Figure 3B:
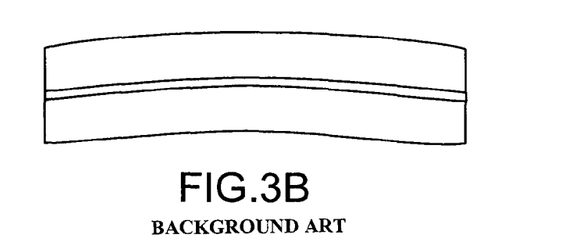

The situation, after returning to room temperature, is illustrated in FIG. 3B, in which a deformation appears.

This deformation induces handling problems in microelectronic equipment. Moreover, it degrades the resolution of the patterns obtained by photolithography.

The problem is therefore posed of finding another technique, by which it is possible to avoid the use of a handle in a material having a heat expansion coefficient too different from that of the substrate to which it is applied.

DISCUSSION OF THE INVENTION

The invention first relates to a method for making a handle wafer for a substrate or a microelectronic component, or a microelectronic functional wafer, including at least one viewing window through the thickness of the handle wafer, this method including:

a) the making of at least one cavity in said handle wafer, b) the formation of at least one viewing window in said cavity, on an alignment or receiving surface or facing such a surface.

By <<functional wafer>> is meant any microelectronic structure, for example a wafer, including components with micronic dimensions.

Further, by <<viewing window>> is understood any element in a material which is transparent at the wavelength used, most often in the visible range, in order to view the marks in the alignment areas. This material may for example be air, or a liquid, or further a solid. Finally, the alignment areas may include one or several alignment marks.

The section of the cavities in a plane of the wafer may be any section: a cavity may have a circular or polygonal section.

This section may have a surface area which may be comprised between for example a few square millimeters and a few square centimeters, for example comprised between 5 mm² and 10 cm².

Each cavity includes an aperture, in the first face of the handle wafer, through which the material of the transparent window is introduced, while the bottom of the cavity is either closed and preferably planar, or lies on a surface, preferably planar, aligned with a second face of the handle wafer, substantially parallel to the first face. There is therefore an alignment surface with which the window or its material may be positioned in each cavity.

According to an embodiment, a through-cavity is formed during step a), and before step b), said handle wafer is assembled with a supporting substrate, which may be withdrawn after step b). This support then provides the alignment or receiving surface or a surface parallel to said alignment or receiving surface.

The wafer and the supporting substrate may be assembled by means of a reversible adhesive bond, in which case it is the adhesive bonding layer which forms the alignment or receiving surface.

The supporting substrate may be withdrawn after step b) by a shear movement of the handle wafer and of the supporting substrate. For this purpose, an adhesive bond of the thermo-fusible polymer type is advantageously used.

Alternatively, a non-through-cavity may be made during step a). It is the bottom of the cavity which then forms the alignment or receiving surface. In this case, a portion of the thickness of the wafer may after step b) be removed so that said at least one cavity is a through-cavity in the thinned wafer.

During step b), a transparent or viewing liquid material may be inserted into said cavity, which material is then solidified.

Alternatively, during step b), at least one transparent or viewing window in a solid material is inserted in said cavity, over all or part of its depth.

The invention also relates to a handle wafer for a microelectronic substrate or a microelectronic functional wafer, including at least one transparent or viewing window and/or cavity through the thickness of the handle wafer.

In a method or device according to the invention:
- the window(s) may be in borosilicate glass or in sodocalcic glass or in fusible glass or in fused silica or in silicone or in polymer,
- and/or the wafer may be in a semiconducting material, or in a ceramic or polymeric material.

The invention also relates to a method for treating or handling a wafer, or a functional wafer, including at least one alignment mark or area, including an assembly of this wafer with a handle wafer according to the invention or obtained by a method according to the invention, so that with a window of the handle it is possible to view all or part of at least one alignment mark through the handle, and then possibly the treatment of said wafer or function wafer. This treatment may for example include at least thinning and/or assembling with another substrate. After treating the functional wafer, the handle wafer may be withdrawn or retained. If it is maintained, it then plays the role of a casing.

The wafer may further include at least one component, for example of the MEMS or NEMS or MOEMS type.

DETAILED DISCUSSION OF PARTICULAR EMBODIMENTS

A first exemplary use of a handle 20' according to the invention is illustrated in FIGS. 4A-4D.

A wafer 2 includes, on its front face 4, alignment marks 6, 6', like the one in FIG. 1A. This wafer is connected through its front face with a wafer 20, also called a handle wafer (FIG. 4A), but the latter is provided with windows, 22, 24, with which it is possible to have access to viewing of the alignment patterns 6, 6'.

Figure 4A:
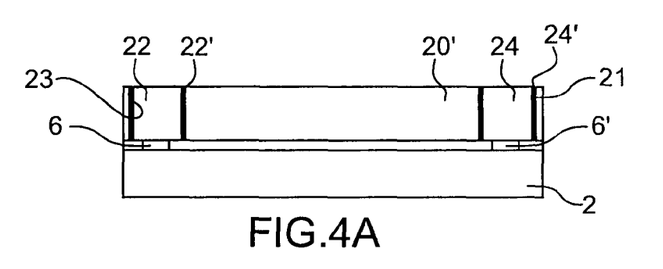
FIGS. 4A-4D illustrate assemblies of a substrate and of a handle according to the invention.
Figure 4B:
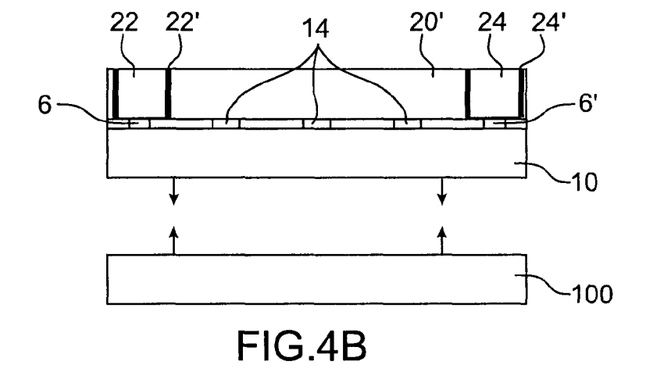

FIG. 4B illustrates an alternative in which the substrate is of the type shown above with FIG. 2 and the surface of which incorporates not only alignment marks 6, 6', but also components 14, for example an MEMS, an NEMS, an MOEMS etc. . . . ). This wafer is connected through its front face with a handle wafer 20', it also is provided with windows 22, 24, with which it is possible to have access to viewing of the alignment patterns 6, 6'.

Figure 4C:
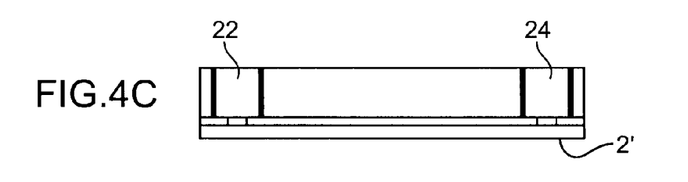

In the case of FIG. 4A, the wafer 2 may then be thinned, and then treated on the rear face 2' in order to form the structure of FIG. 4C. The same result may be obtained with the wafer 10 of FIG. 4B. Other treatments of the wafer 2 may be carried out, alternatively or in combination with thinning, for example assembling with another substrate 100 such as the substrate of FIG. 4B.

In FIGS. 4A-4C, the gap between the windows and the edges of the holes 21, 23 made in the wafer and in which windows are formed, is filled with a coating 22', 24'.

Figure 4D:
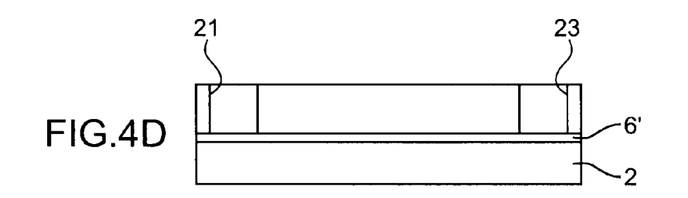

In an alternative, discussed in FIG. 4D, introducing or forming a window is omitted, in particular a solid window in these holes.

Figure 5A:
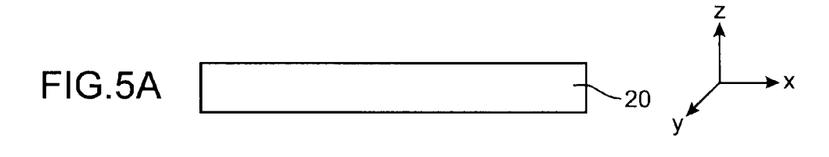
FIGS. 5A-5G illustrate a first method for making a handle according to the invention.
Figure 6A:
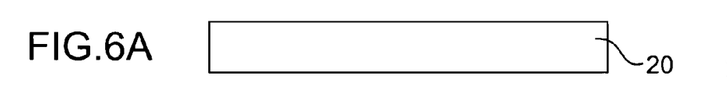
FIGS. 6A-6D illustrate a second method for making a handle according to the invention.
Figure 7A:
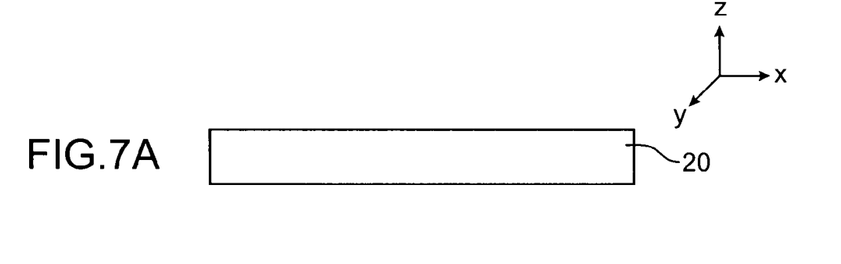
FIGS. 7A-7F illustrate a third method for making a handle according to the invention.

Several exemplary embodiments of a handle wafer, according to the invention, will be described. At the beginning of all these examples, a starting wafer 20 for example in silicon or in another semiconducting material such as AsGa, or a ceramic or a polymer (FIGS. 5A, 6A, 7A) is considered. Thus, the wafer into which will be integrated the windows has a thermal expansion coefficient (TEC) equivalent or close to that of the wafer to be treated (or further functional wafer), which will be then transferred onto the wafer provided with windows. Generally, the wafer to be treated is in a semiconducting material, for example silicon.

The wafer which will allow formation of the handle wafer has an extension in an xy plane. Its thickness E, measured along a direction z perpendicular to the xy plane is small, for example comprised between a few hundred micrometers and a few millimeters, for example further comprised between 100 μm and 1 mm or 5 mm.

Figure 5B:
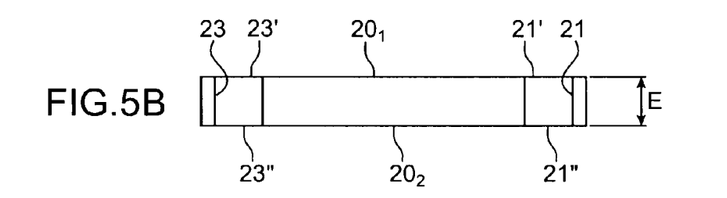
Figure 6B:
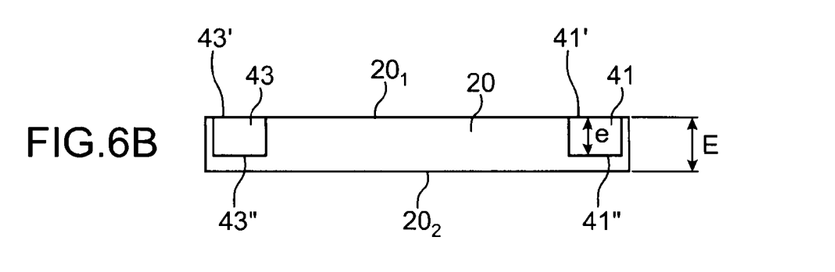
Figure 7B:
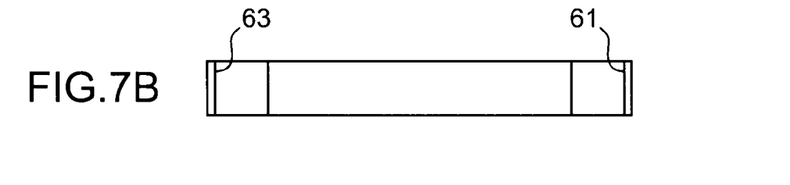
Figure 7C:
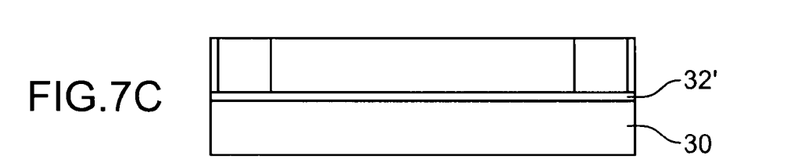
Figure 7D:
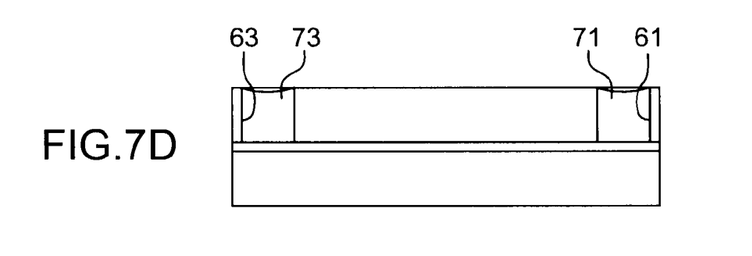
Figure 7E:
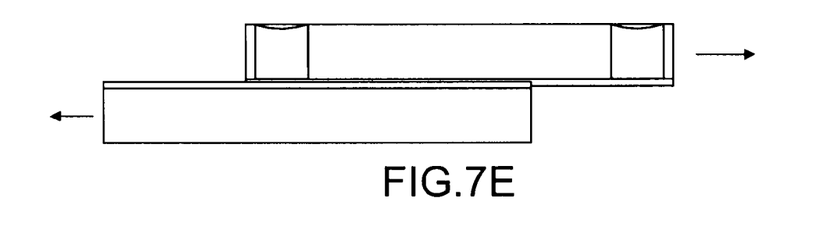

Cavities 21, 23 41, 43, 61, 63 are made in this wafer 20 by etching (FIGS. 5B, 6B, 7B). Among the techniques which may be used for this etching, mention may be made of laser techniques or by ultrasonic machining, or by sanding, or by a plasma or chemical technique (notably: etching with KOH, TMAH, or xenon fluoride).

In the miscellaneous given examples, the windows may for example be in a solid or solidified material, for example borosilicate glass or in sodocalcic glass or in fusible glass or in fused silica or in silicone or in epoxy.

The first example will be described in connection with FIGS. 5A-5F.

As explained above, cavities 21, 23 are made in the handle wafer 20 by etching (FIG. 5B). The obtained cavities 21, 23 are here through-cavities; they therefore have a thickness identical with that E of the actual wafer.

Figure 5C:
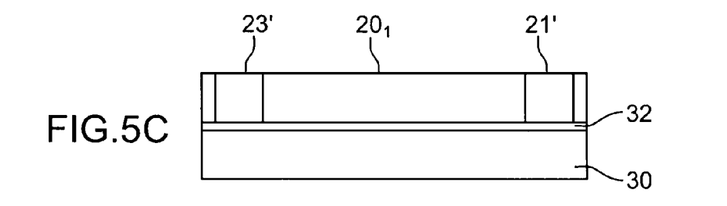

This wafer provided with its cavities is temporarily transferred onto a support 30 with a planar surface, provided with an adhesive layer 32 (FIG. 5C). The latter for example is of the thermofusible type, the adhesion of which may be suppressed by heating.

Each cavity initially includes an aperture 21', 23', in a first main face $20_1$ of the handle wafer 20, through which the material of the transparent window will then be introduced. By transfer onto the supporting wafer 30, the second aperture 21", 23" of each cavity is closed. Thus, the bottom of the cavity lies on a planar surface aligned with a second face $20_2$ of the handle wafer 20, substantially parallel to the first face $20_1$.

Figure 5D:
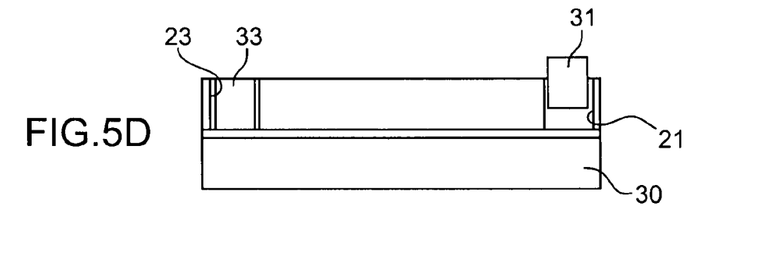
Figure 5E:
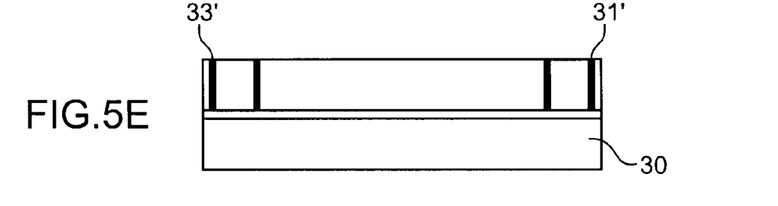

A transparent window 31, 33, for example in glass, in quartz or in polymer, may then be positioned or introduced into each cavity 21, 23 (FIG. 5D). The support 30 or the surface of its adhesive layer opposite to the surface of the support 30 on which lies this layer, provides a planar receiving or alignment surface for properly positioning the window in the cavity in the vertical direction z, perpendicular to the xy plane of the wafer 20. But the window may not fill the cavity and be in particular set back relatively to this receiving surface.

It is then proceeded with sealing the windows in these cavities. The sealing material is designated in FIG. 5E by the references 31',33'.

It is then possible to withdraw the support (FIG. 5F) by removing the adhesive, which releases the second face $20_2$ of the wafer. The windows 31, 33 are then exposed at each of the two faces $20_1$, $20_2$.

Figure 5F:
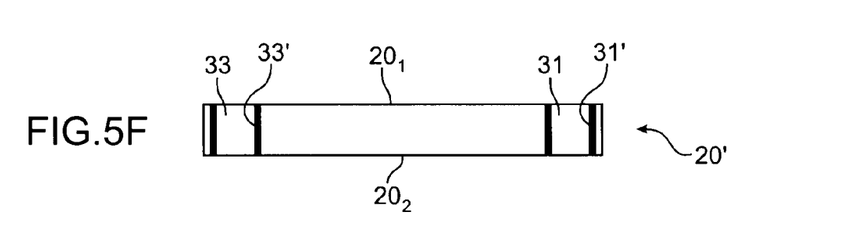

It may also be proceeded with polishing of the front and rear faces of the thereby obtained wafer 20' in order to have optical quality.

Figure 5G:
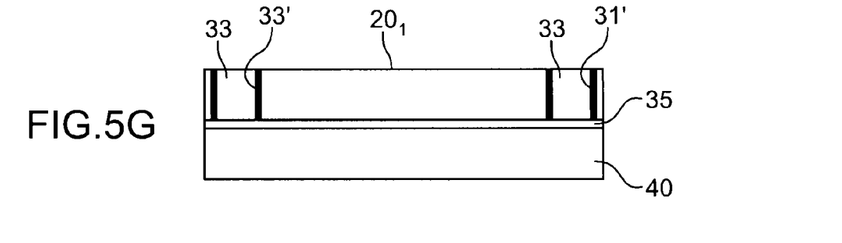

The wafer 20' with its windows 31, 33 may then be transferred onto another wafer 40 by known technologies, for example of the wafer bonding type by means of a resin 35, of a fusible material of the eutectic type or by anodic sealing (FIG. 5G). This wafer 40 may be of the type of the wafer 2 or of the wafer 10 as described above, respectively, in connection with FIGS. 1A and 2, and include alignment patterns or marks as already explained. These patterns or marks, positioned on the front face, may be seen through the windows of the handle and are thus used for allowing alignment of the rear face.

Another exemplary embodiment is illustrated in FIGS. 6A-6D.

In the initial wafer 20 (FIG. 6A), cavities 41, 43 are again made by etching in this wafer. Unlike the embodiment discussed earlier, the obtained cavities 41, 43 are not through-cavities here, they therefore have a smaller depth e than the thickness E of the actual wafer.

Figure 6C:
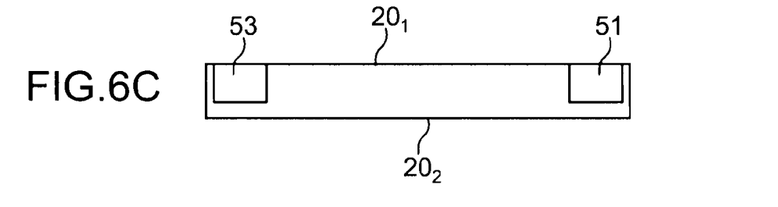

It is then proceeded with filling these cavities with a transparent material 51, 53, but this time in the liquid or pasty state, while the windows 31, 33 of the previous example were introduced into the cavities 21, 23 while being in the solid state. Fusible glass or fused silica or a UV- or heat-polymerizable polymer for example may be selected here. This material is then solidified, under temperature conditions allowing this.

Each cavity includes an aperture 41', 43', in the first main face $20_1$ of the handle wafer 20, through which the material of the transparent window is introduced. The non-etched bottom 41", 43" of each cavity 41, 43 defines a planar surface for properly positioning the material of each window in the corresponding cavity, in a plane parallel to the xy plane of the wafer 20 and along the vertical direction z, perpendicular to the xy plane of the wafer 20.

Figure 6D:
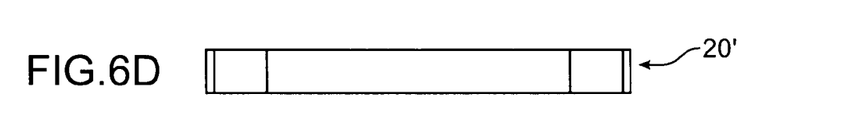

It may then be proceeded with thinning of the wafer as far as at least the bottom 41", 42" of each cavity, in order to expose, on each of the two main faces $20_1$, $20_2$ of the wafer, the thereby produced transparent window, the transparent material now being solid. The thickness difference between the wafer and the cavities 41, 43 is thereby suppressed. Polishing of the front and rear faces of the thinned wafer is possibly further performed in order to obtain optical quality.

This embodiment does not require the application of a back-up (or supporting) wafer like the wafer 30 of the previous embodiment. The alignment of the windows in the second plane of the handle is advantageously achieved by means of the bottom 41", 43" of each cavity. With this embodiment, it is in particular possible to use an initially liquid material.

Another exemplary embodiment is illustrated in FIGS. 7A-7F.

There again, starting with an initial wafer 20, cavities 61, 63 are made in this wafer by etching (FIG. 7B). Unlike the embodiment discussed earlier, the obtained cavities 61, 63 are again through-cavities here, they therefore have a depth e equal to the thickness E of the actual wafer.

This wafer provided with its cavities is temporarily transferred onto a support 30 with an adhesive 32' (FIG. 7C) in order to form a planar alignment or receiving surface. The adhesive for example is of the thermofusible type, the adhesion of which may be suppressed by heating, for example of the type of that developed by Breewer Science for temporary wafer adhesive bonding.

The role of the this support 30 and/or of its adhesive 32', for aligning or positioning the windows, along the axis z perpendicular to the substrate, is the same as in the case of the embodiment explained above in connection with FIGS. 5A-5G.

It is then proceeded with filling these cavities with a transparent material 71, 73, in the liquid state (FIG. 7D), for example a transparent polymer of the epoxy or silicone type. This material is then solidified, under temperature conditions allowing this.

It is then possible to remove the support 30 (FIG. 7E) by high temperature shearing of the layer 32.

Figure 7F:
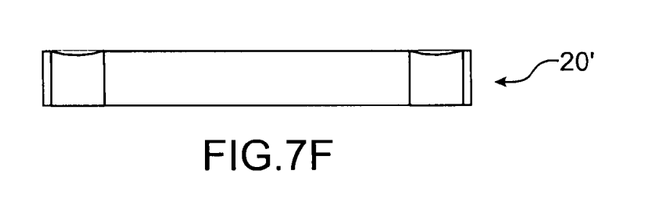
Figure 8:
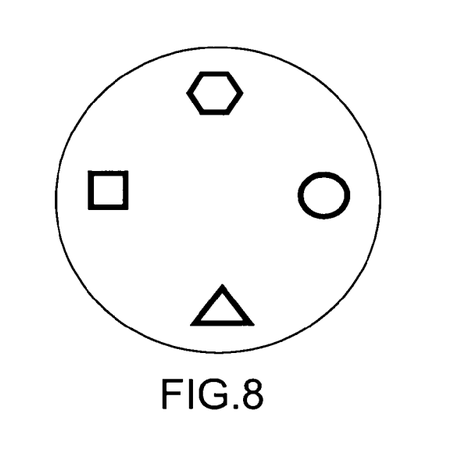
FIG. 8 illustrates a handle device according to the invention in a top view.

It is also possible to proceed with cleaning and/or polishing of the front and rear faces of the thereby obtained wafer 20' in order to have optical quality.

Whichever the selected embodiment, the windows may be sufficiently wide so as to be visible by any type of alignment equipment or else dedicated to an application or a particular piece of equipment. For example a window has a width or maximum size, measured along a direction parallel to the surface of the substrate 20, of the order of a few tens of micrometers to a few hundred micrometers or a few millimeters, for example comprised between 100 μm and 3 mm or 5 mm.

Advantageously the windows of a handle wafer according to the invention have polished faces so as not to lose resolution.

A viewing window of a handle substrate according to the invention preferably has transparence to radiation in an observational spectral range, which at least includes part of the visible spectrum (most pieces of photolithographic equipment include sensitive cameras in the range of visible light) or for example, between 400 nm or 450 nm or 500 nm on the one hand, and 600 nm or 700 nm or 750 nm on the other hand. The transparent material of the window may for example be a glass or a polymer.

The invention further concerns an equipment, in particular for photolithography, comprising at least one substrate or a wafer as disclosed above, with a viewing or imaging device or a camera sensitive in at least one spectral range, for example at least one of those mentioned above, in which at least one of the windows of the substrate or the wafer is at least partially transparent.

The invention is claimed:

1. A handle wafer for microelectronic functional wafers, including at least one cavity through the thickness of the wafer, the at least one cavity including a viewing window in solid or solidified material, and a material that fills a gap between the at least one cavity and the viewing window.

2. The wafer according to claim 1, wherein at least one window is in borosilicate glass or in sodocalcic glass or in fusible glass or in fused silica or in silicone or in polymer.

3. The wafer according to claim 1, wherein the wafer is in a semiconducting material, or in a ceramic or polymeric material.

4. A method for treating a functional wafer including at least one alignment area, including:
    assembling the functional wafer with the handle wafer according to claim 1, so that the window allows all or part of at least one alignment area to be viewed through said handle wafer; and
    then treating said functional wafer.

5. The method according to claim 4, further including obtaining the functional wafer, which includes at least one component.

6. The method according to claim 5, wherein said component is an MEMS or an NEMS or an MOEMS.

7. The method according to claim 4, further including removing said handle wafer after the treating of said functional wafer.

8. The wafer according to claim 1, wherein the wafer is in a ceramic material.

9. The wafer according to claim 1, wherein the wafer is in a polymeric material.

* * * * *